United States Patent [19]

Yamada

[11] Patent Number: 5,100,823
[45] Date of Patent: Mar. 31, 1992

[54] METHOD OF MAKING BURIED STACKED TRANSISTOR-CAPACITOR

[75] Inventor: Shunichi Yamada, Nishikimachi, Japan

[73] Assignee: Motorola, Inc., Schaumburg, Ill.

[21] Appl. No.: 161,925

[22] Filed: Feb. 29, 1988

[51] Int. Cl.$^5$ .......................................... H01L 21/70
[52] U.S. Cl. ................................ 437/52; 437/47; 437/48; 437/60; 437/99; 437/203; 437/919; 357/23.6
[58] Field of Search ................ 437/47, 48, 52, 60, 437/99, 109, 160, 203, 919; 357/23.6

[56] References Cited

U.S. PATENT DOCUMENTS

| Re. 32,090 | 3/1986 | Jaccodine et al. | 357/51 |
|---|---|---|---|
| 4,240,195 | 12/1980 | Clemens et al. | 437/48 |
| 4,536,947 | 8/1985 | Bohr et al. | 437/60 |
| 4,569,701 | 2/1986 | Oh | 148/188 |
| 4,577,395 | 3/1986 | Shibata | 29/576 |
| 4,630,237 | 12/1986 | Miura et al. | 365/104 |
| 4,650,544 | 3/1987 | Erb et al. | 156/653 |
| 4,651,184 | 3/1987 | Malhi | 357/23.6 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,683,643 | 8/1987 | Nakajima et al. | 437/203 |
| 4,686,552 | 8/1987 | Teng et al. | 357/23.6 |
| 4,688,063 | 8/1987 | Lu et al. | 357/23.6 |
| 4,713,678 | 12/1987 | Womack et al. | 357/23.4 |
| 4,728,623 | 3/1988 | Lu et al. | 437/60 |
| 4,734,384 | 3/1988 | Tsuchiya | 437/203 |
| 4,791,463 | 12/1988 | Malhi | 357/51 |
| 4,797,373 | 1/1989 | Malhi et al. | 437/162 |
| 4,824,793 | 4/1989 | Richardson et al. | 437/919 |

FOREIGN PATENT DOCUMENTS 0108390 5/1984 European Pat. Off.
0179571 9/1985 Japan.

OTHER PUBLICATIONS

Mohan Rao, "Epitaxial Layer Blocks Unwanted Charge in MOS RAMs," Electronics 6-30-81, pp. 103-105.
A. H. Shah, "A 4-Mbit DRAM with Trench-Transistor Cell", IEEE Journal of Solid-State Circuits, vol. SC-21, No. 5, Oct. 1986, pp. 618-626.

Primary Examiner—Tom Thomas
Attorney, Agent, or Firm—Joe E. Barbee; Stuart T. Langley

[57] ABSTRACT

A buried interconnected transistor and capacitor are formed in a trench etched in a semiconductor wafer having a lightly doped surface layer. The trench extends through the surface layer into the substrate. A dielectric liner is provided in the trench and the trench partially refilled with polysilicon up to the surface layer. The dielectric liner is removed thereby exposing sidewalls of the surface layer in the trench. Further silicon is deposited which forms additional poly material on the poly plug, single crystal material on the exposed epi-sidewalls, and further poly above the single crystal material. A dielectric is formed over the deposited material and a gate electrode deposited over the single crystal portion on the sidewall. The poly plug serves as one plate of a buried trench capacitor and the single crystal material accommodates the channel of the series MOSFET connected to the poly plug capacitor plate.

8 Claims, 3 Drawing Sheets

METHOD OF MAKING BURIED STACKED TRANSISTOR-CAPACITOR

TECHNICAL FIELD

This invention relates to semiconductor integrated circuits and, more particularly, to methods and structures for trench type memory storage cells.

BACKGROUND OF THE INVENTION

It is known in the art to form dynamic semiconductor memory cells utilizing buried transistors and capacitors formed in trenches in a semiconductor substrate. Because such buried transistor-capacitor cells are compact, very large numbers of such cells can be accommodated on a single semiconductor chip, for example, 4 Mega-bits or more per chip. A typical prior art structure and method is described by A. H. Shah, "A 4-Mbit DRAM with Trench-Transistor Cell", IEEE Journal of Solid-State Circuits, Vol. SC-21, No. 5, October 1986, pages 618-626.

While prior art trench type transistor-capacitor cells have demonstrated the feasibility of forming very high bit count single chip semiconductor memories, such prior art cells and memories suffer from a number of limitations and disadvantages. For example, as the individual transistor-capacitor cells are moved closer and closer together to provide greater packing density and larger bit counts, it becomes more and more difficult to isolate the individual cells from each other. Further, the prior art structures and methods have undesirably high contact and line resistance which limits memory speed. Additionally, comparatively large diffused cell contact areas used in the prior art increase the susceptibility of the memory cells to soft bit errors.

These and other problems are overcome by the structure and method of the present invention. Accordingly, it is an object of the present invention to provide an improved structure and method for buried transistor-capacitor cells for semiconductor memories and other device functions.

It is a further object of the present invention to provide an improved cell having a smaller footprint than conventional cells so as to permit closer packing and higher bit counts in the same chip area.

It is an additional object of the present invention to provide an improved cell utilizing a buried MOSFET and capacitor wherein the material forming the channel region of the MOSFET is deposited separately from the remainder of the semiconductor substrate.

It is a further object of the present invention to provide an improved cell having low resistance contacts and intercell connections.

It is an additional object of the present invention to provide an improved cell wherein the buried transistor-capacitor structure is self-aligned.

For convenience of explanation, certain semiconductor regions are denoted as P or N in the structures and method illustrated herein. However, those of skill in the art will understand that this is merely for ease of explanation and not intended to be limiting, and that the invention being described includes arrangements where the conductivity types are inverted or where other combinations of P and N regions are used. The words trench and cavity are used interchangeably herein and are intended to refer to an opening extending from a principal surface of a semiconductor wafer or a semiconductor layer, part way through the thickness of the wafer or through the layer.

SUMMARY OF THE INVENTION

A dielectric coated semiconductor wafer having, for example, a buried heavily doped (e.g. P+) region and a lightly doped (e.g. P−) surface layer, is etched to form a trench or cavity therein. It is desirable that the cavity extend through the lightly doped surface layer into the underlying heavily doped region. A dielectric liner is formed on the interior surface of the cavity. The dielectric lined cavity is partially refilled with semiconductor, for example, heavily doped (e.g. N+) polysilicon to form a poly plug in the cavity insulated from the semiconductor sidewalls of the cavity by the dielectric liner. The dielectric liner above the poly plug is removed to re-expose the sidewalls of the lightly doped surface layer.

Additional semiconductor is then deposited on the upper surface of the wafer above the dielectric coating and in the cavity. This additional semiconductor material is initially desirably neutral or, for example, lightly doped the same type as the semiconductor surface layer. A first part of the deposited semiconductor forms additional poly on the poly plug, slightly raising the level of the plug in the cavity. It becomes highly doped by out-diffusion from the initial poly plug. A second part forms additional undoped or lightly doped single crystal material on the sidewall of the surface layer and extending laterally into the cavity. A third part forms additional poly on the dielectric coated upper surface of the wafer and also at the upper rim of the cavity above and in contact with the added single crystal material forming on the sidewall of the cavity. The third part (including the poly rim) is heavily doped, e.g., comparable to the poly plug. All parts of the additional semiconductor layer are formed at the same time and are continuously connected.

A second dielectric is then provided on the additional semiconductor material in the cavity and a conductor deposited thereon. This conductor conveniently forms the gate of a buried MOSFET in the cavity and is coupled to the word line of the memory array between the cavities. A further dielectric and conductor are provided for the bit line.

The heavily doped (e.g. P+) substrate forms one plate of a buried capacitor and the heavily doped (e.g. N+) poly plug in the cavity serves as the other plate. The additional undoped or lightly doped (e.g. P−) single crystal material formed on the sidewall of the cavity accommodates the channel region of a buried MOSFET. Part of the heavily doped (e.g. N+) poly plug contacts this additional single crystal material in the cavity and acts as the source of the buried MOSFET. The heavily doped (e.g. N+) poly rim also contacts the additional single crystal material and acts as a drain for the MOSFET. The second dielectric is the gate dielectric and the conductor placed thereon is the MOSFET gate. Current flow in the channel of the MOSFET is therefore approximately parallel to the depth direction of the cavity and approximately parallel to and spaced from the original cavity sidewall in the added single crystal semiconductor material.

The integration of the heavily doped (e.g. N+) poly rim drain with the heavily doped (e.g. N+) poly extending over the dielectric coated surface of the wafer makes it possible to connect one cell to another cell without a large drain-substrate PN junction area and without a separate drain to cell interconnection contact. This provides both lower intercell conductor resistance and reduced soft error sensitivity. Also, the poly drain reduces the isolation distance required between adjacent cells because of its smaller area as compared to a diffused drain. Further, the dopant concentration and profile in the added single crystal material where the channel forms may be different than that in the surface layer so that the expansion of the drain field into the surface layer is controlled. These properties of the invented structure combine to permit a more compact structure. These are particular features of the present invention.

These and other features and advantages of the invented structure and method will be more readily understood by consideration of the accompanying drawings and detailed explanation which follows.

DETAILED DESCRIPTION OF THE DRAWINGS

Figure 1:
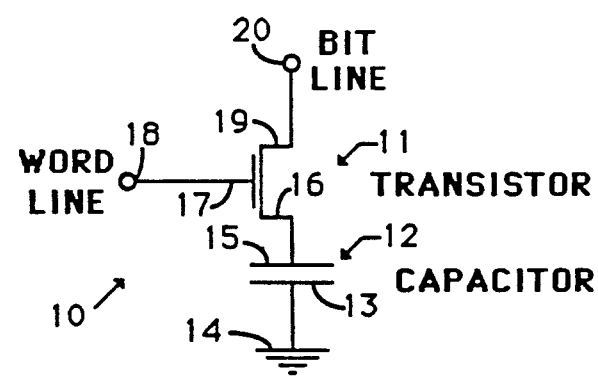
FIG. 1 shows an electrical schematic of a transistor-capacitor storage cell.

FIG. 1 shows an electrical schematic of transistor-capacitor memory storage cell 10. Cell 10 comprises serially connected transistor 11 and capacitor 12. Capacitor 12 is composed or plate 13 tied to common terminal 14 and plate 15 tied to source 16 of transistor 11. Gate 17 of transistor 11 is tied to word line 18 and drain 19 of transistor 11 &s tied to bit line 20. This circuit is well known in the art.

Figure 2:
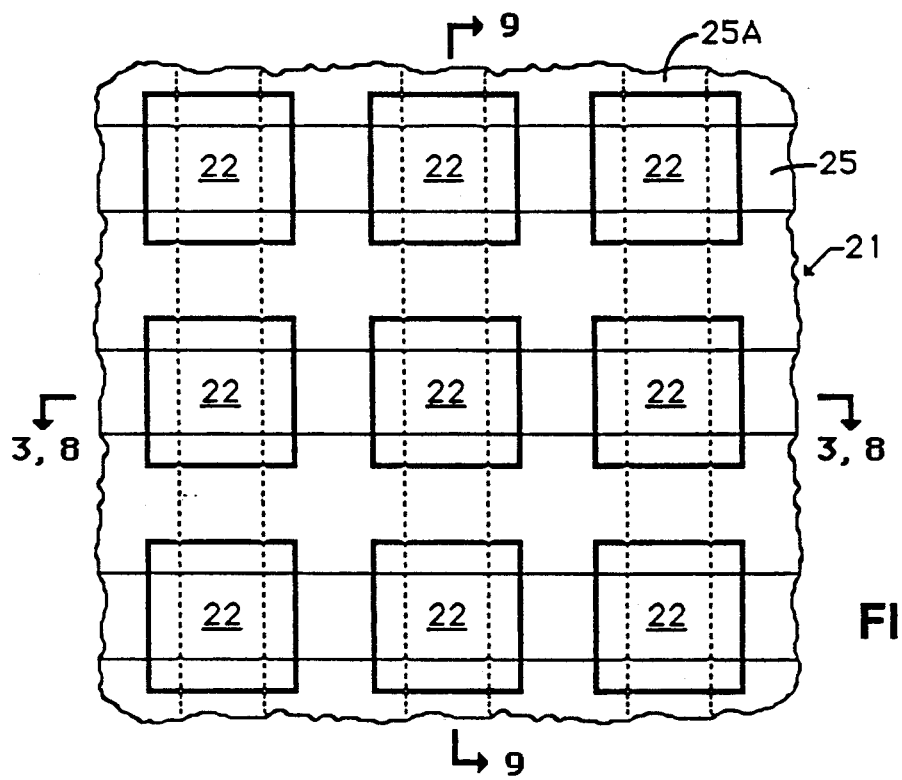
FIG. 2 shows a simplified plan view of a partial array of trench type memory cells.
Figure 3:
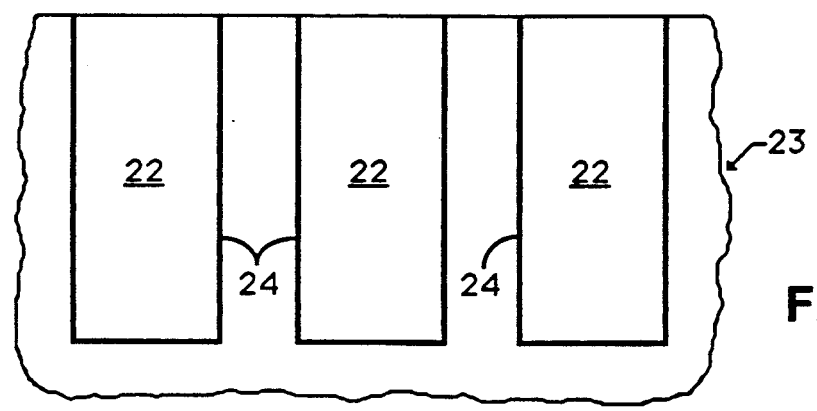
FIG. 3 shows a highly simplified cross-sectional view through the partial array of FIG. 2 showing the trenches in which the storage cells are formed.

When very high bit count memories are fabricated the individual memory cells represented by circuit 10 are desirably formed in trenches or cavities formed in a semiconductor layer or substrate. FIG. 2 is a highly simplified plan view of partial array 21 of substantially identical memory cells 22 in semiconductor substrate 23 interconnected by overlying bit and word lines 25, 25A. FIG. 3 is a highly simplified cross-sectional view through array 21 showing that substantially identical cells 22 are formed in trenches or cavities 24 extending into substrate 23. The present invention is particularly concerned with an improved method and structure for forming cells 22 in cavities 24 that makes them highly compact, allows closer cell-to-cell spacing and gives improved performance.

FIGS. 4–8 are cross-sectional views similar to FIG. 3 but showing the internal construction of cells 22 in trenches 24 in greater detail and during different stages of fabrication, according to the present invention. Those of skill in the art will understand that although FIGS. 4–8 provide greater detail they are simplified schematic representations of the actual cell cross-sections intended to illustrate the important features of cell construction.

Figure 4:
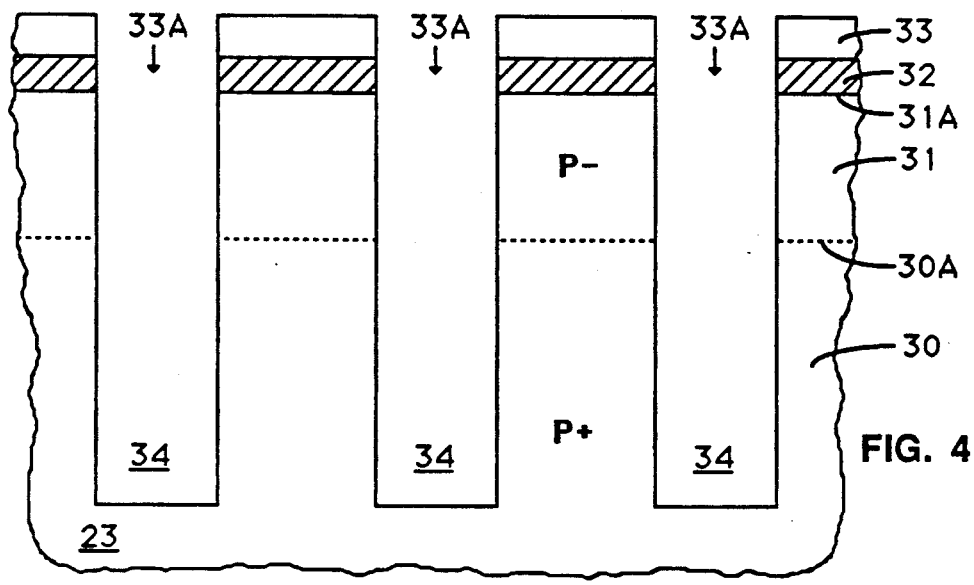
FIGS. 4–8 show simplified cross-sectional views similar to FIG. 3, but in greater detail and at different stages of fabrication, according to the present invention.

Considering now FIG. 4, semiconductor wafer substrate 23 is desirably formed with highly doped buried region 30 and overlying lightly doped surface layer or region 31 joined at 30A. Regions 30 and 31 may be continuous, i.e., occupying the whole wafer, or may be localized, i.e., be formed only in certain locations in the wafer. It is convenient but not essential to form substrate 23 by using a highly doped wafer for region 30 and growing lightly doped layer or region 31 thereon by epitaxy. Such techniques are well known in the art. However, if region 30 or 31 are desired to be localized to the particular location of an array, regions 30 and 31 may be formed by localized doping and/or epitaxial growth. Such techniques are well known in the art. Silicon is a convenient material for substrate 23 but other substrates may be used, such as for example, other semiconductor wafers or semiconductor layers grown on an insulating or semi-insulating substrate.

Surface 31A of layer 31 is provided with dielectric layer 32 of, for example, silicon oxide and/or silicon nitride or a combination tnereof. Thermal oxidation is a preferred method of forming silicon oxide on silicon and low pressure chemical vapor deposition (LPCVD) is a well known technique for forming either or both silicon oxide and silicon nitride or mixtures thereof on silicon or other semiconductors. Sputtering or evaporation may also be used.

Figure 5:
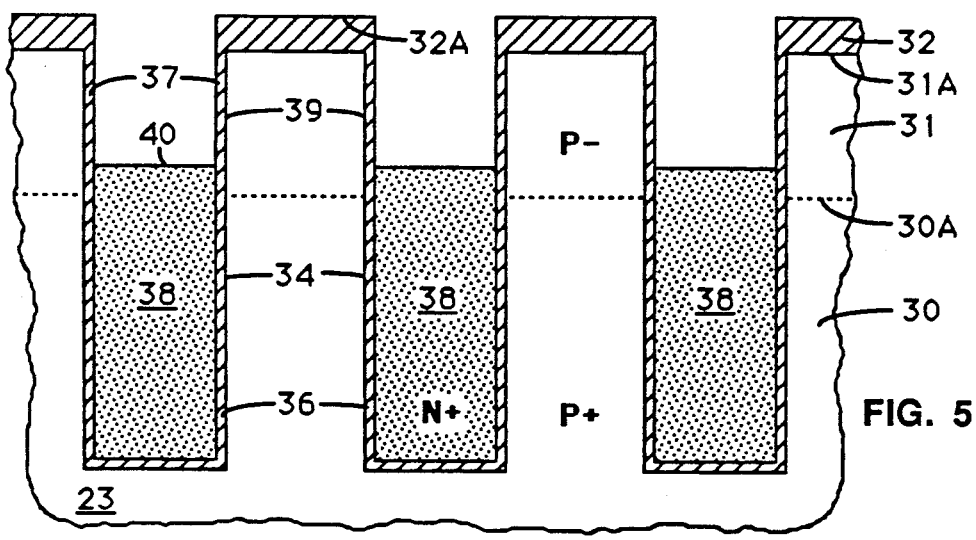

Mask layer 33 is applied on dielectric 32 and provided with openings 33A through which layer 32 and substrate 23 are etched to form cavities 34 (analogous to cavities 24 of FIG. 3) extending through surface layer 31 into underlying sub-region or layer 30. Cavities 34 are then provided with dielectric liner 36 as shown in FIG. 5. This is conveniently accomplished by thermal oxidation which is a well known technique for providing dielectric layers on semiconductors of precisely known thickness and properties. However, other techniques well known in the art may also be used, as for example, anodization, LPCVD,, plasma assisted, CVD, sputtering and the like.

Poly plug 38 is then formed on dielectric liner 36 in cavity 34 so as to only partially fill cavity 34 (see FIG. 5). It is desirable that upper surface 40 of poly plug 38 be above interface 30A between highly doped region 30 and lightly doped region 31. Poly plug 38 is conveniently formed by depositing poly over the whole wafer and then removing the excess poly from surface 32A and in cavity 34 by selective etching. Means for depositing and selectively etching poly with respect to dielectrics 32, 36 are well known in the art. However, other means for forming poly plug 38 may also be used. No masking operation is required but may be used if other portions of the wafer must be protected during the deposition and/or etching steps.

Figure 6:
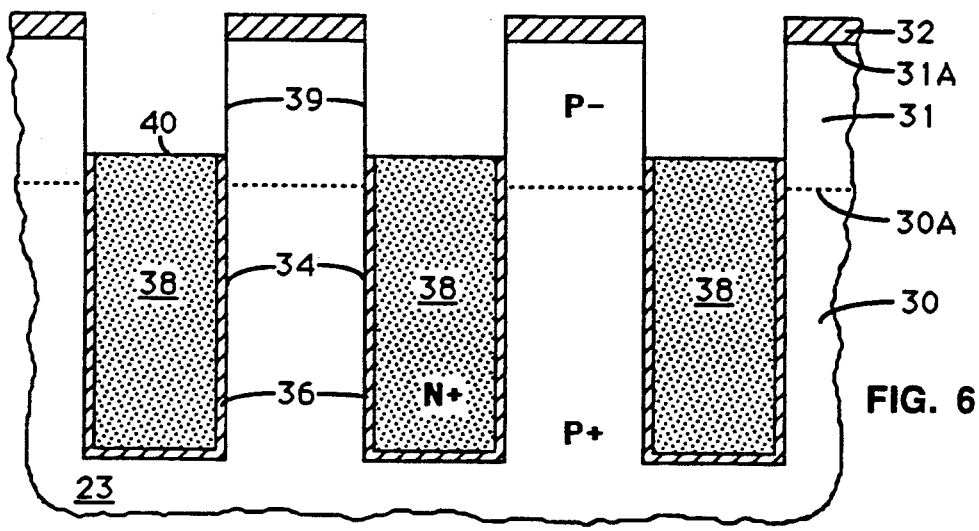

Portion 37 of dielectric 36 above surface 40 of poly plug 38 is then removed by, for example, a simple dip etch (see FIG. 6). No masking operation is required but may be used if desired for protecting other portions of the wafer. Removal of portion 37 of dielectric liner 36 re-exposes sidewall 39 of upper layer 31 in cavity 34 above surface 40 (see FIG. 6).

Figure 7:
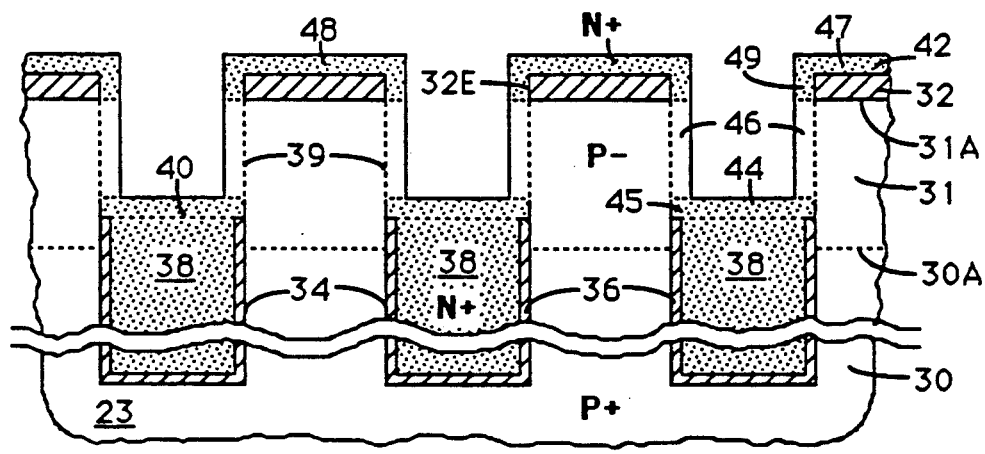

Additional semiconductor layer 42 is then applied to wafer 23 (see FIG. 7). Deposition conditions are adjusted using means well known in the art so that layer 42 is seeded by the underlying material, that is, portion 44 of layer 42 forming on surface 40 of poly plug 38 is additional polycrystalline material adding to plug 38, portion 46 forming on single crystal sidewall 39 of layer 31 is additional single crystal material extending laterally into cavity 34, and portion 48 forming on dielectric layer 32 is polycrystalline material. Portion 48 includes part 47 which grows directly above dielectric 32 and part 49 which seeds from lateral edge 32E of layer 32 and grows above additional single crystal region 46. Part 49 forms a polycrystalline semiconductor rim surrounding the upper end of cavity 34 at about surface 31A that is continuously connected with both added poly 47 over dielectric 32 and added single crystal region 46. The lower end of added single crystal region 46 is continuously connected at 45 with added region 44 of poly plug 38.

Additional semiconductor layer 42 is desirably deposited undoped or very lightly doped so that region 46 remains undoped or very lightly doped so as to be suitable for containing the channel region of the buried MOSFET. However, as those of skill in the art will appreciate based on the description herein, the doping of additional layer 42 may be adjusted and may be graded during deposition so that region 46 has the desired average doping and dopant profile.

It will be noted that varying the doping profile during formation of portion 46 produces a doping profile that varies as a function of the normal to the cavity wall (i.e., the horizontal direction in FIG. 7) as compared to the doping profile of surface layer 31 which varies as a function of the normal to the substrate surface (i.e., the vertical direction in FIG. 7). These effects may be combined to provide two dimensional doping profile control of the trench transistor channel region.

The ability to vary the doping profile of the added single crystal material in the cavity is a particular feature of the present invention and permits the threshold voltage and other properties of the buried MOSFET to be controlled without the channel implant adjustments or other treatments which are widely used for planar surface MOSFETS but which are extremely difficult if not impossible to do in a sidewall MOSFET buried within such a trench or cavity.

Portion 46 of additional semiconductor layer 42 accommodates the channel of the buried MOSFET. Poly portion 45 of layer 42 acts as the source for the buried MOSFET and poly region 49 acts as the drain for the buried MOSFET. Accordingly, it is important that regions 45 and 49 be heavily doped and, where portion 46 has been doped, that 45 and 49 be of opposite type from 46. This is easily accomplished with the present method and structure.

Poly portions 44, 45 of layer 42 are seeded by highly doped poly plug 38 and are automatically doped from poly plug 38 during deposition of layer 42, Thus, where poly plug is N+, then portions 44, 45 will also be N+. This is the appropriate type and concentration where an N− channel MOSFET is desired in undoped or lightly P doped region 46. Because the mobility of dopant in poly is much greater than in single crystal material, dopant migration from poly plug 38 into portions 44, 45 will be comparatively much larger and occur at a much lower temperature than dopant migration from single crystal sidewall 39 into added single crystal region 46. Thus, source region 45 will become highly doped while channel region 46 may be kept substantially at the doping provided during deposition of layer 42. However, doping from sidewall 39 into channel region 46 may be increased by additional heating of the device during or after deposition of region 46. This is especially useful where a vertical doping gradient is desired to be formed in added single crystal portion 46.

Portion 48 (including parts 47, 49) of layer 42 has substantially the as-deposited doping since it is not formed on a dopant source as were portions 44, 45. Accordingly, in order to have poly part 49 be highly doped to function as a low resistance drain contact, portion 48 is separately doped. This is conveniently accomplished by ion implantation so as to produce a high dopant concentration and low resistance in portion 48, including part 47 above dielectric 32 and part 49 above single crystal portion 46. The ion implantation is directed substantially normal to the substrate or at most at a slight angle to the normal to the substrate. Accordingly, there is essentially no implantation into portion 46 on sidewall 39. Portion 46 remains substantially undoped during doping of portion 48. Thus, part 49 becomes an effective drain contact for the buried MOSFET formed in added single crystal portion 46. No masking operation is required to dope portion 48, including parts 47, 49. Where an N-channel device is desired, N+ doping is used.

Dielectric layer 50 (see FIG. 8) is provided over layer 42 and conductor 52 formed thereon. Layer 50 may be provided anytime after depositing layer 42, for example, either before or after doping portion 48. Dielectric 50 acts as the gate dielectric above channel region 46 and also isolates gate conductor 52.(coupled to the word line) from poly plug 38, 44. Additional dielectric 54 is provided over conductor 52 and bit line connections or other conductor 56 placed thereon.

Figure 8:
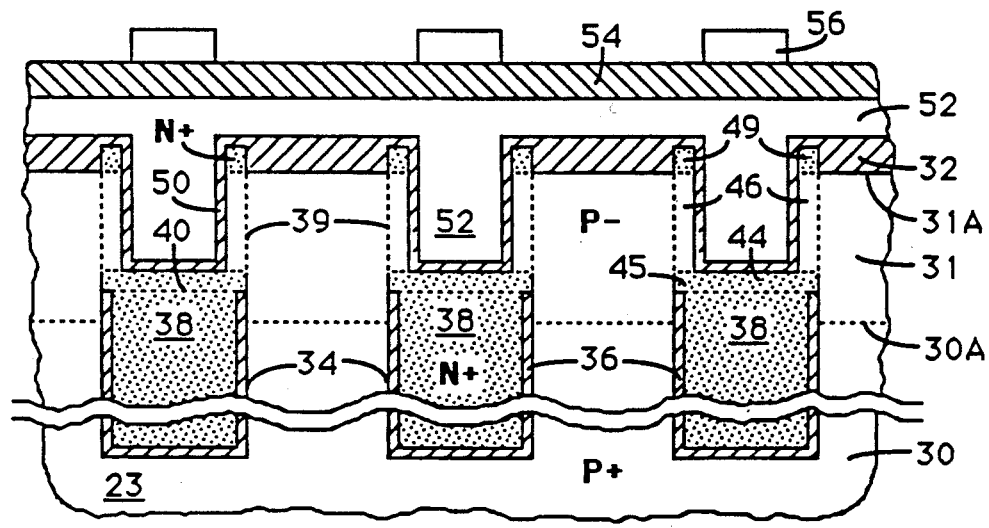

Before or after doping of drain contact part 49, part 47 of layer 48 between adjacent cells may be etched away in one direction of array 21 so as to isolate the cells in that direction. This is shown in FIG. 8. However, in the other, orthogonal direction, it may be desired that the drains of the buried MOSFETS be connected. This is shown in FIG. 9, which is a cross-sectional view through array 21 of FIG. 2 at right angles to that shown in FIG. 8 and otherwise similar to FIG. 8.

Figure 9:
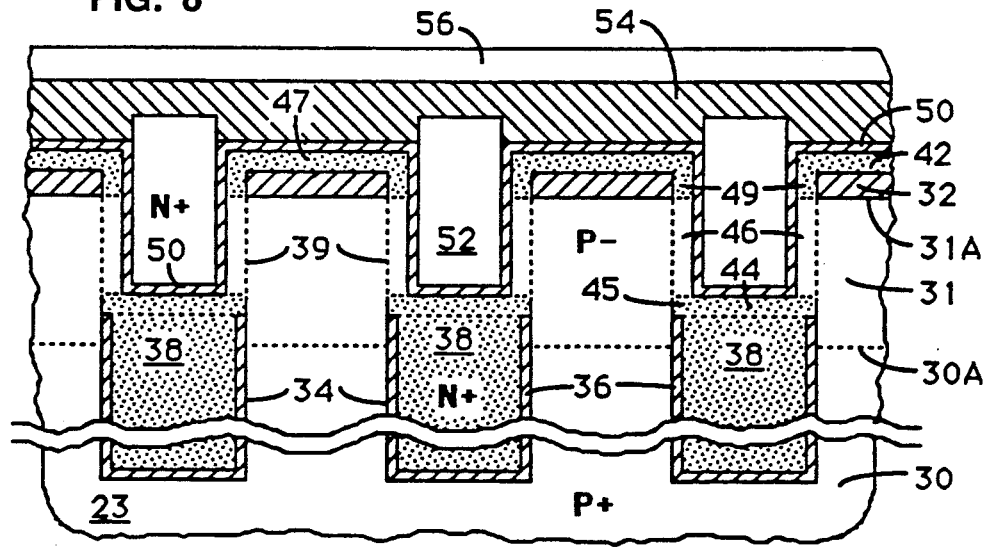
FIG. 9 shows a cross-sectional view similar to FIG. 8 but at right angles thereto through the array of FIG. 2.

It will be apparent from FIGS. 8-9, that rim-shaped poly drain 49 has a minimal area relative to the size of channel region 46. Those of skill in the art will also recognize that this poly drain is substantially smaller than the diffused drain that has been used in the prior art. Further, part 47 of poly 48 extending between adjacent cells in the orthogonal direction (see FIG. 9) lies on dielectric 32, whereas with prior art devices a diffused connection in surface 31A of substrate has frequently been used. The isolation afforded by layer 32 may be made larger and the capacitance smaller than with a diffused interconnection, while still achieving very low series resistance. By minimizing drain junction area and avoiding interconnect junction area, the sensitivity of the memory cell to alpha particle soft bit errors is much reduced.

In addition, with the present method and structure, little or no lateral spreading allowance need be provided for a conventional diffused drain junction. Accordingly, the spacing which must be provided for cell-to-cell isolation is reduced and the cells may be placed closer together. This gives a more compact structure and further reduces series resistance and shunt capacitance. Both effects contribute to improved performance.

The following are typical examples of the dimensions of various layers and openings suitable for cells used in a high bit count memory chip of 4 megabits per chip or higher. Those of skill in the art will understand that these dimensions are for purposes of explanation and are not intended to be limiting. Among other things, they may be scaled to larger and smaller dimensions using means well known in the art.

Cavity 34 is conveniently about 2-3 micrometers square, with about 2.5 micrometers being typical, and about 5-10 micrometers deep with about 7 micrometers being typical. Surface layer 31 is conveniently about 2-5 micrometers thick with about 4 micrometers being typical. The cavity lining dielectric, which forms the capacitor dielectric has a thickness typically in the range of about 80-200 Angstrom units with about 120 Angstrom units being convenient. Layer 42, particularly portion 46 is typically in the range of about 0.5-1.2 micrometers thick with about 0.8 micrometers being convenient. Portions 44, 48 of layer 42 which seed as poly may be somewhat thicker if the growth rate of the poly exceeds the growth rate of single crystal portion 46, but this is not harmful, and so far as series resistance is concerned is desirable. Dielectric layer 32 has typically a finished thickness after processing of about 0.5-1.2 micrometers with about 0.7 micrometers being convenient. The effective source-drain width (i.e., along the vertical direction of single crystal region 46 between poly portions 45 and 49) is typically about 0.8-1.6 micrometers with about 0.8 micrometers being convenient. Gate dielectric 50 is typically about 100-400 Angstroms thick with about 250 Angstroms being convenient. Word line 52 is typically about 3-4 micrometers thick and is desirably formed of a highly conductive intermetallic such as, for example, tungsten silicide or the like. Means for forming such materials are well known in the art. Bit line interconnection 56 may be of any convenient conductor such as doped poly, intermetallic, or metal and thicknesses in the range of a few tenths to several micrometers are useful. As will be appreciated by those of skill in the art based on the description given herein, larger and smaller trenches and layer thicknesses may be used. Those of skill in the art will understand how the capacitance and resistance of such layers varies as a function of their dimensions.

Thus, it is apparent that there has been provided in accordance with the invention an improved structure and method for buried transistor-capacitor cells for semiconductor memories and other circuit functions, that the improved memory cells have a smaller lateral size and may be packed closer together than before and that contact and interconnection resistance is reduced and that the elements within the trench cell are automatically self aligned. Overall, the process for forming the transistor-capacitor combination within the cavity or trench requires few masking steps which is very advantageous for manufacturing purposes.

While the invention has been described in terms of certain materials, e.g., silicon, silicon oxide, silicon nitride, etc., and while the trench cavities have been illustrated as being of rectangular shape, it will be apparent to those of skill in the art that other materials having analogous properties may also be used and that the invention may be applied to a wide variety of combinations of N and P doping and different geometries of trenches or cavities. Accordingly, it is intended to encompass in the claims that follow, all such variations falling within the scope of the invention.

What is claimed is:

1. A method for forming a buried semiconductor structure, comprising:

providing a single crystal semiconductor substrate having an upper surface;
   forming an epi-layer on the substrate;
   forming a first dielectric on the epi-layer, wherein the first dielectric is at least 0.5 microns thick;
   forming a cavity extending through the first dielectric layer, the epi-layer, and into the substrate;
   forming a second dielectric on the surface of the cavity;
   partially filling the cavity with a first polycrystalline semiconductor deposited on the second dielectric;
   removing the second dielectric layer above the polycrystalline semiconductor thus exposing a portion of the epi-layer at a sidewall of the cavity and exposing the first dielectric layer at the top of the cavity; and
   forming a semiconductor layer lining the cavity and extending outside of the cavity on top of the first dielectric layer.

2. The method of claim 1 wherein the semiconductor layer comprises a second polycrystalline region on top of the first polycrystalline region, a third polycrystalline region covering the first dielectric layer, and a single crystal region covering the exposed portion of the epi-layer.

3. The method of claim 2 further comprising the step of implanting impurities into the second and third polycrystalline regions.

4. The method of claim 1 wherein the first dielectric is from 0.5 to 1.2 micrometers thick.

5. The method of claim 1 further comprising the step of etching the semiconductor layer so that a portion of the semiconductor layer does not extend beyond the lateral boundaries of the cavity.

6. A method for forming serially connected buried transistors and capacitor regions in a cavity formed in a substrate wherein the cavity is partially dielectrically lined and partially refilled with a polycrystalline semiconductor, comprising simultaneously (a) partly refilling the cavity with a polycrystalline semiconductor, (b) forming an epitaxial single crystal region on a sidewall of the cavity above the polycrystalline semiconductor, and (c) forming a further polycrystalline semiconductor above a principal surface of the substrate from which the cavity extends and extending into the cavity, wherein a portion of the further polycrystalline semiconductor forms a rim totally within the interior boundary of the cavity.

7. A method for forming a serially coupled capacitor and transistor in a cavity formed in a semiconductor substrate comprising the steps of: forming an epi-layer on the substrate; forming a first dielectric layer on the epi-layer; etching the cavity through the first dielectric layer, the epi-layer, and into the substrate; lining the cavity with a capacitor dielectric; partially filling the cavity with a first semiconductor material; removing the capacitor dielectric above the first semiconductor material; forming a second semiconductor material lining the cavity and having lateral surfaces on top of the first semiconductor material and at the top of the cavity, and a vertical surface lining a sidewall of the cavity; ion implanting impurities into the lateral surfaces of the second semiconductor material; and patterning the second semiconductor material to form a bit line, which extends away from the cavity over the first dielectric layer, and a rim-shaped drain which lies totally within the interior boundary of the cavity.

8. The method of claim 7 wherein the width of the cavity is at least as large as the width of the bit line.

* * * * *